(12) United States Patent
Atsuta et al.

(10) Patent No.: US 11,329,184 B2
(45) Date of Patent: May 10, 2022

(54) PHOTODETECTOR AND LIDAR DEVICE COMPRISING A DETECTOR HAVING A PN JUNCTION CONNECTED TO AN OPTICALLY TRANSMISSIVE QUENCH RESISTOR

(71) Applicant: Kabushiki Kaisha Toshiba, Minato-ku (JP)

(72) Inventors: Masaki Atsuta, Yokosuka (JP); Kazuhiro Suzuki, Meguro (JP); Ikuo Fujiwara, Yokohama (JP); Honam Kwon, Kawasaki (JP); Keita Sasaki, Yokohama (JP); Yuki Nobusa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 477 days.

(21) Appl. No.: 16/553,221

(22) Filed: Aug. 28, 2019

(65) Prior Publication Data

US 2020/0295217 A1 Sep. 17, 2020

(30) Foreign Application Priority Data

Mar. 14, 2019 (JP) .............................. JP2019-047376

(51) Int. Cl.
*G01S 17/894* (2020.01)
*H01L 31/107* (2006.01)
(Continued)

(52) U.S. Cl.
CPC .......... *H01L 31/107* (2013.01); *G01S 7/4816* (2013.01); *G01S 17/08* (2013.01); *H01L 27/1443* (2013.01); *H01L 28/22* (2013.01)

(58) Field of Classification Search
CPC ... H01L 31/107; H01L 31/109; H01L 27/146; G01S 17/894; G01S 17/08; G01S 17/06;
(Continued)

(56) References Cited

U.S. PATENT DOCUMENTS 8,791,538 B2  7/2014 Yamamoto et al.
9,344,661 B2  5/2016 Saito et al.
(Continued)

FOREIGN PATENT DOCUMENTS

EP  2 960 939 A1  12/2015
EP  3 396 723 A1  10/2018
(Continued)

OTHER PUBLICATIONS

Kim, W., et al., "Highly tunable local gate controlled complementary graphene device performing as inverter and voltage controlled resistor", Nanotechnology, vol. 24, No. 39, Sep. 6, 2013, XP 020251380, pp. 1-5.

*Primary Examiner* — Que Tan Le
(74) *Attorney, Agent, or Firm* — Oblon, McClelland, Maier & Neustadt, L.L.P.

(57) ABSTRACT

A photodetector according to the present embodiment includes a plurality of light detectors. Each light detector has a first semiconductor layer of a first conductive type and a second semiconductor layer of a second conductive type different from the first conductive type, in which the first semiconductor layer and the second semiconductor layer constitute a PN junction. The photodetector further includes a quench resistor that is optically transmissive and connected to the second semiconductor layer.

12 Claims, 13 Drawing Sheets

(51) Int. Cl.
    *G01S 7/481*    (2006.01)
    *G01S 17/08*    (2006.01)
    *H01L 27/144*   (2006.01)
    *H01L 49/02*    (2006.01)

(58) Field of Classification Search
    CPC .......... G01S 17/04; G01S 17/86; G01S 17/88; G01J 1/44
    USPC .................................. 250/214 R, 221, 214.1
    See application file for complete search history.

(56)                References Cited

U.S. PATENT DOCUMENTS

| 9,385,155 | B2 | 7/2016 | Yamamoto et al. |
| 10,192,923 | B2 | 1/2019 | Yamamoto et al. |
| 10,224,361 | B2 | 3/2019 | Yamamoto et al. |
| 10,396,107 | B2 * | 8/2019 | Yamamura .............. H01L 27/14 |
| 2015/0380457 | A1 | 12/2015 | Fujii et al. |
| 2018/0090535 | A1 | 3/2018 | Fujii et al. |
| 2019/0051767 | A1 | 2/2019 | Yamamoto et al. |

FOREIGN PATENT DOCUMENTS

| JP | 2010-536186 | A | 11/2010 |
| JP | 2015-117970 | A | 6/2015 |
| JP | 5984617 | B2 | 9/2016 |
| JP | 2016-219805 | A | 12/2016 |
| JP | 2017-75906 | A | 4/2017 |
| JP | 2017-117836 | A | 6/2017 |
| JP | 6193171 | B2 | 9/2017 |

* cited by examiner

PHOTODETECTOR AND LIDAR DEVICE COMPRISING A DETECTOR HAVING A PN JUNCTION CONNECTED TO AN OPTICALLY TRANSMISSIVE QUENCH RESISTOR

CROSS-REFERENCE TO RELATED APPLICATIONS

This application is based upon and claims the benefit of priority from the prior Japanese Patent Application No. 2019-047376 filed in Japan on Mar. 14, 2019; the entire contents of which are incorporated herein by reference.

FIELD

Embodiments describe herein relate generally to a photodetector and a lidar device.

BACKGROUND

There is known a lidar (Light Detection and Ranging, or Laser Imaging Detection and Ranging) device capable of sensing the distance to an object by receiving reflected light while emitting light to the object. In recent years, application of the lidar device to, for example, automatic driving of an automotive vehicle is expected.

The lidar device includes a photodetector that receives the reflected light. For example, a silicon photomultiplier (SiPM) is used as this kind of photodetector. The SiPM has, for example, avalanche photodiodes (APDs) that are two-dimensionally disposed in a matrix pattern. A reverse bias voltage higher than the breakdown voltage is applied to each APD. Thus, each APD operates in Geiger mode. The APD operating in the Geiger mode has higher gain and can detect weak light.

In the APD constituting the SiPM, so-called electron avalanche occurs when photons enter. Therefore, a quench resistor for converging the electron avalanche is provided in the APD. The quench resistor is required to be long enough to secure a sufficient resistance value. Therefore, wiring employed for the quench resistor is routing it around or on top of the APD.

However, routing the quench resistor around or on top of the APD may reduce the aperture ratio of the APD and cause reduction in sensitivity of the APD.

DETAILED DESCRIPTION

Figure 1:
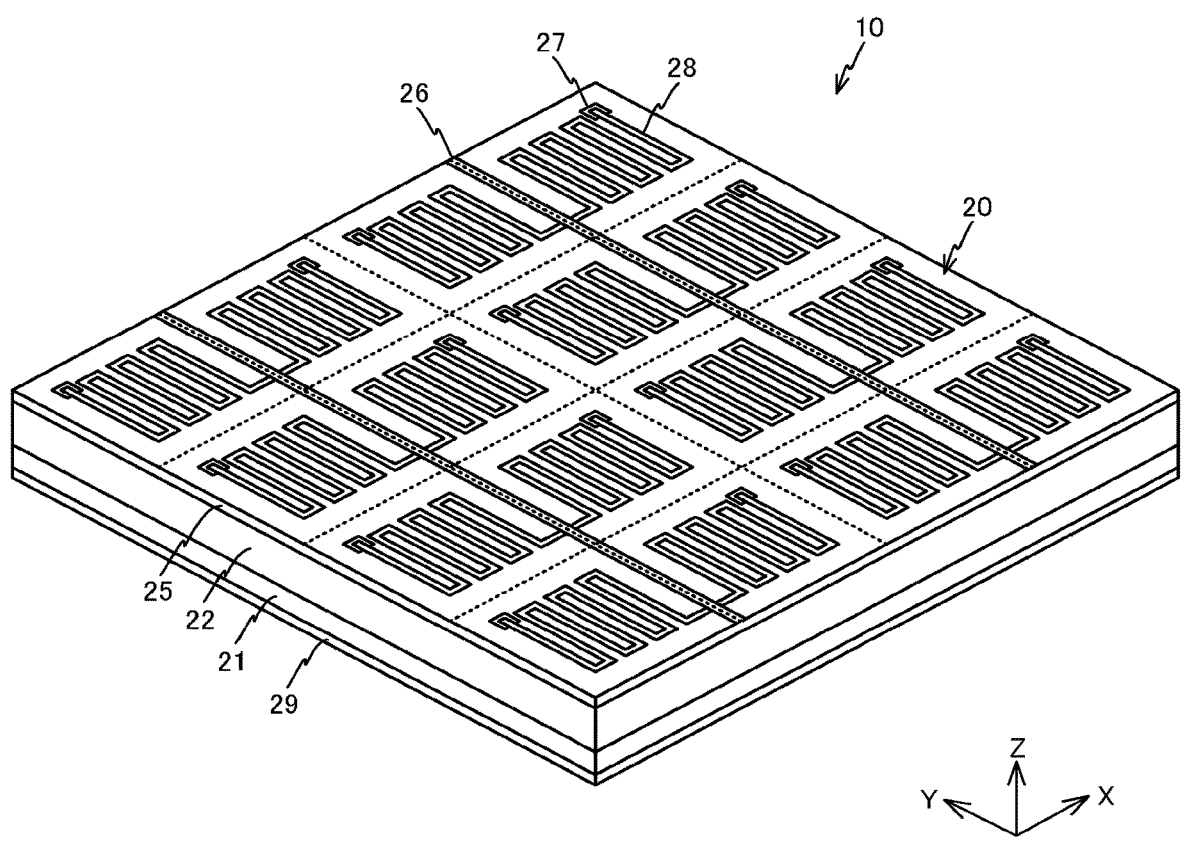
FIG. 1 is a perspective view of a photodetector according to a first exemplary embodiment.

A photodetector according to the present embodiment includes a plurality of light detectors and a quench resistor. Each light detector has a first semiconductor layer of a first conductive type and a second semiconductor layer of a second conductive type different from the first conductive type, in which the first semiconductor layer and the second semiconductor layer constitute a PN junction. The quench resistor is optically transmissive and connected to the second semiconductor layer.

Hereinafter, the present embodiment will be described with reference to drawings. In the following description, an XYZ coordinate system constituted by mutually orthogonal X-, Y-, and Z-axes is used appropriately. Further, in the drawings to be referred to, illustrations of a substrate and respective layers stacked on this substrate are schematic in thickness and size, and therefore they do not necessarily coincide with the actual thickness and the actual size.

First Embodiment

FIG. 1 is a perspective view of a photodetector 10 according to the present embodiment. The photodetector 10 is, for example, a square, rectangular, hexagonal, circular, or any other plate-like photodetector, which is usable for a lidar device or the like. The photodetector 10 includes a semiconductor substrate 21, a semiconductor layer 22, an insulation layer 25, and a common electrode 29. Further, the photodetector 10 is provided with a plurality of light detectors 20. In the present embodiment, for example, sixteen light detectors 20 are defined in a matrix pattern of 4 rows and 4 columns. Respective light detectors 20 are electrically and optically separated from each other so that no interference occurs between the light detectors. The separation of respective light detectors can be realized, for example, by providing a trench structure between neighboring light detectors 20 or by changing the type or concentration of impurities in a silicon layer between neighboring light detectors 20. Further, to realize this, the photodetector 10 can be formed to have a selective oxidizing element isolation structure (LOCOS: Local Oxidation of Silicon).

Figure 2:
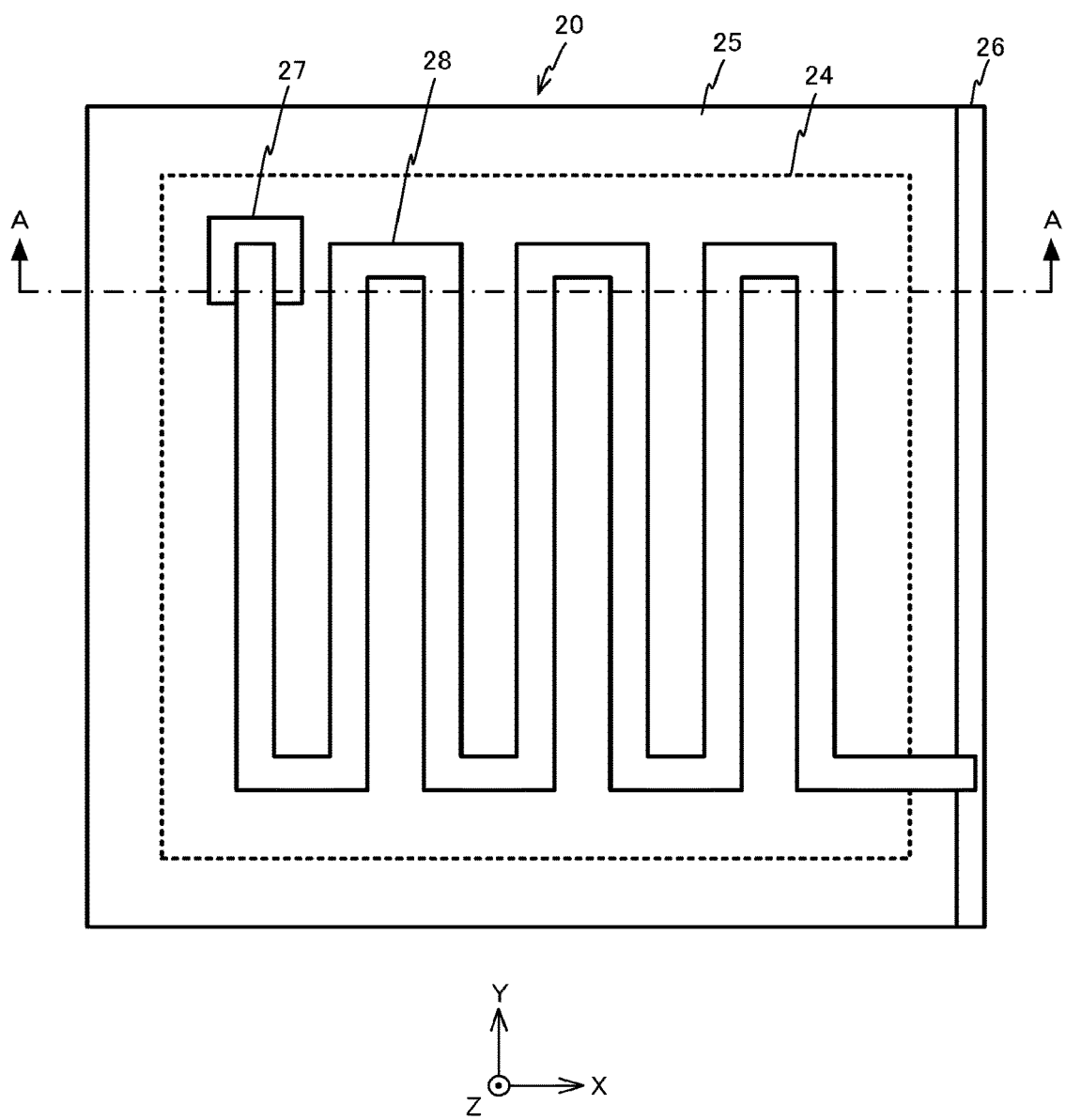
FIG. 2 is a plan view of a light detector.
Figure 3:
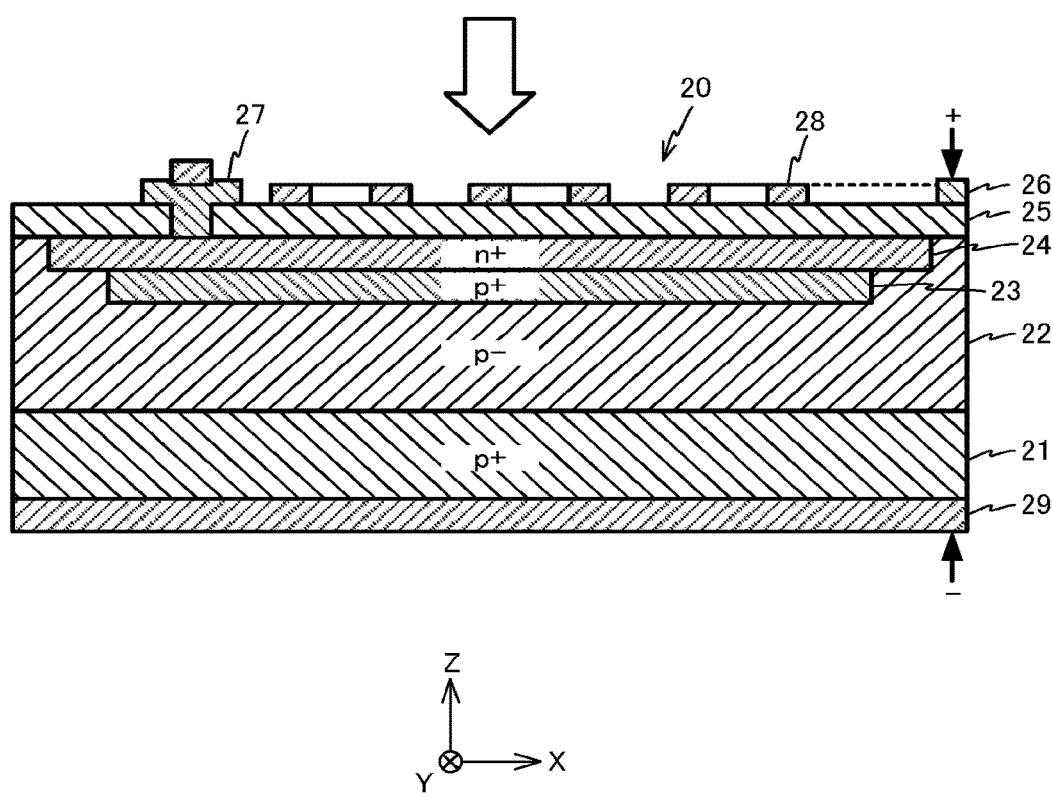
FIG. 3 is a cross-sectional view of the light detector.

FIG. 2 is a plan view of the light detector 20. FIG. 3 is a cross-sectional view of the light detector 20 illustrated in FIG. 1, taken along a line A-A. As illustrated in FIG. 3, the light detector 20 includes the semiconductor substrate 21 of P+ type, the semiconductor layer 22 of P− type formed on the upper surface of the semiconductor substrate 21, and the insulation layer 25 formed on the upper surface of the semiconductor layer 22. A semiconductor layer 23 of P+ type and a semiconductor layer 24 of N+ type stacked on the upper surface the semiconductor layer 23 are formed between the semiconductor layer 22 and the insulation layer 25. The semiconductor layer 23 and the semiconductor layer 24 constitute a PN junction. Further, a quench resistor 28 is formed on the upper surface of the insulation layer 25.

The semiconductor substrate 21 is a substrate made of crystalline P-type silicon. The common electrode 29 is formed on the lower surface of the semiconductor substrate 21. The common electrode 29 is, for example, a single layer made of a metal, such as copper (Cu), aluminum (Al), platinum (Pt), gold (Au), silver (Ag), titanium (Ti), nickel (Ni), or W (tungsten), or made of one type of material, such as an alloy containing other elements in any of these metals or a graphene material, or is a lamination layer of a plurality types of different materials.

The semiconductor layer 22 is a P− type semiconductor layer stacked on the semiconductor substrate 21. The semiconductor layer 22 is formed on the upper surface of the semiconductor substrate 21, for example, by epitaxial growth.

The semiconductor layer 23 is a P+ type semiconductor layer, which is formed on the upper surface of the semiconductor layer 22. The semiconductor layer 23 is formed almost entirely on the semiconductor layer 22 constituting the light detector 20. The semiconductor layer 23 is a semiconductor layer formed partly in the semiconductor layer 22, for example, by implanting impurities, such as boron (B), into the semiconductor layer 22.

The semiconductor layer 24 is an N+ type semiconductor layer, which is stacked on the semiconductor layer 23. The semiconductor layer 24 is, for example, formed by epitaxial growth on the upper surface of the semiconductor layer 23.

The insulation layer 25 is made of, for example, silicon dioxide ($SiO_2$), silicon nitride ($SiN_x$) or the like. The insulation layer 25 can be formed by sputtering, chemical vapor deposition (CVD) or the like.

As illustrated in FIG. 2, a common wire 26, a contact electrode 27, and the quench resistor 28 are formed on the upper surface of the insulation layer 25.

The common wire 26 is a wiring line provided across the plurality of light detectors 20, as illustrated in FIG. 1. In the present embodiment, the common wire 26 is provided across eight light detectors 20. The common wire 26 is, for example, a single layer made of a metal, such as copper (Cu), aluminum (Al), platinum (Pt), gold (Au), silver (Ag), titanium (Ti), nickel (Ni), or W (tungsten), or made of one type of material, such as an alloy containing other elements in any of these metals or a graphene material, or is a lamination layer of a plurality types of different materials. The common wire 26 can be formed, for example, by vapor deposition, sputtering or the like.

As illustrated in FIG. 3, the contact electrode 27 is constituted by a via conductor positioned in the insulation layer 25 and a rectangular conductor pattern positioned on the upper surface of the insulation layer 25. The contact electrode 27 is an electrode electrically contacting the semiconductor layer 24 when the via conductor is connected to the semiconductor layer 24. Like the common wire 26, the contact electrode 27 is, for example, a single layer made of a metal, such as copper (Cu), aluminum (Al), platinum (Pt), gold (Au), silver (Ag), titanium (Ti), nickel (Ni), or W (tungsten), or made of one type of material, such as an alloy containing other elements in any of these metals or a graphene material, or is a lamination layer of a plurality types of different materials.

As illustrated in FIG. 2, the quench resistor 28 is a resistance circuit provided between the common wire 26 and the contact electrode 27. Since the resistance value of the quench resistor 28 is proportional to the wiring length, the quench resistor 28 is wired so as to increase the resistance value by meandering on the upper surface of the insulation layer 25. Alternatively, if the wiring width is reduced to increase the resistance value, the quench resistor can be formed to have a linear wiring shape. If a sufficiently high resistance value can be obtained, the wiring shape may be plate-like.

The quench resistor 28 is constituted by a monoatomic or unimolecular layer, or by a two-dimensional semiconductor layer, which has transmitting properties to the light to be detected by the photodetector 10. Specifically, the quench resistor 28 is constituted by a graphene layer. The resistance value of a graphene layer that is, for example, 10 μm in width and 10 μm in length is approximately 2,500Ω. The quench resistor 28 is, for example, 1 μm in width and 136 μm in length. In this case, the resistance value of the quench resistor 28 is 340 kΩ. The quench resistor 28 constituted by the graphene layer is formed on the upper surface of the insulation layer 25 by, for example, a transfer method or epitaxial growth.

As illustrated in FIG. 1, the sixteen light detectors 20 are respectively disposed in the matrix pattern. Further, the semiconductor substrate 21, the semiconductor layer 22, the insulation layer 25, and the common electrode 29 are common to the sixteen light detectors 20 as members constituting each light detector 20 and are integrally formed as the photodetector 10.

In the light detector 20, a reverse bias voltage is applied as a driving voltage between the common wire 26 and the common electrode 29. The driving voltage is set to be equal to or higher than the breakdown voltage of the light detector 20. When the driving voltage being equal to or greater than the breakdown voltage is applied between the common wire 26 and the common electrode 29, the light detector 20 operates in the Geiger mode.

As indicated by an outlined arrow in FIG. 3, when light (photons) enter the light detector 20, avalanche multiplication occurs in the semiconductor layer 23 and the semiconductor layer 24, which constitute the PN junction, and numerous carriers are generated. These carriers move to the common wire 26 via the contact electrode 27 and the quench resistor 28. Thus, photoelectric current corresponding to the incidence of photons flows through the common wire 26. The photoelectric current is detected by an external device via the common wire 26. The external device can detect the amount or intensity of the detected photons based on detection current from each light detector 20 constituting the photodetector 10. Further, when the photoelectric current flows through the quench resistor 28, the voltage applied to the light detector 20 falls below the breakdown voltage, and the photoelectric current generated by one photon converges.

Figure 4:
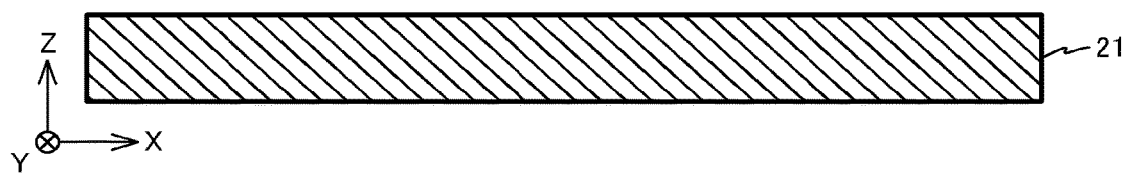
FIG. 4 is a diagram illustrating a manufacturing process of the photodetector.

Next, an exemplary method for manufacturing the photodetector 10 having the above-described configuration will be described. First, as illustrated in FIG. 4, the semiconductor substrate 21 is prepared. The semiconductor substrate 21 is the substrate made of crystalline P-type silicon. The semiconductor substrate 21 is a substrate cut out from an ingot formed by, for example, Czochralski method (CZ method).

Figure 5:
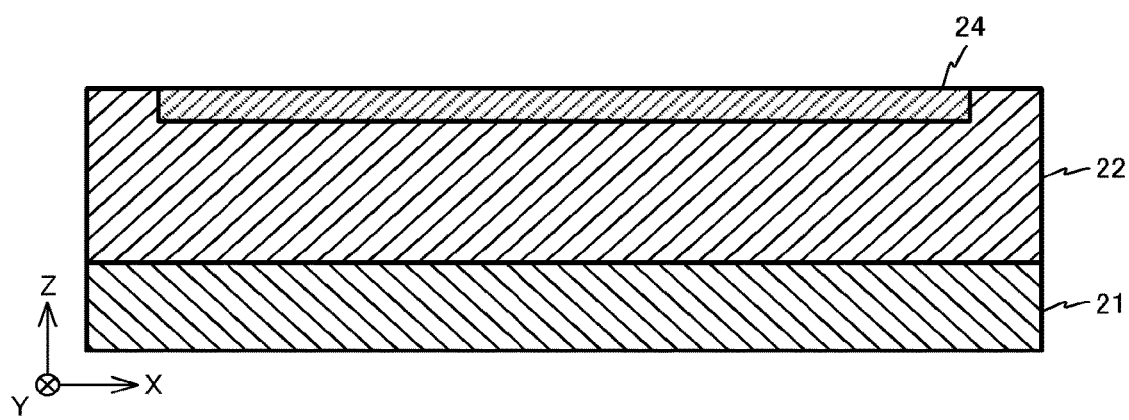
FIG. 5 is a diagram illustrating a manufacturing process of the photodetector.

Next, as illustrated in FIG. 5, the semiconductor layer 22 is formed on the upper surface of the semiconductor substrate 21. The semiconductor layer 22 can be formed, for example, by epitaxial growth. In the epitaxial growth, it is conceivable to use, for example, silicon tetrachloride (SiCl₄) or the like.

Next, the semiconductor layer 24 is formed on the upper surface of the semiconductor layer 22. The semiconductor layer 24 can be formed, for example, by ion implantation or epitaxial growth.

Figure 6:
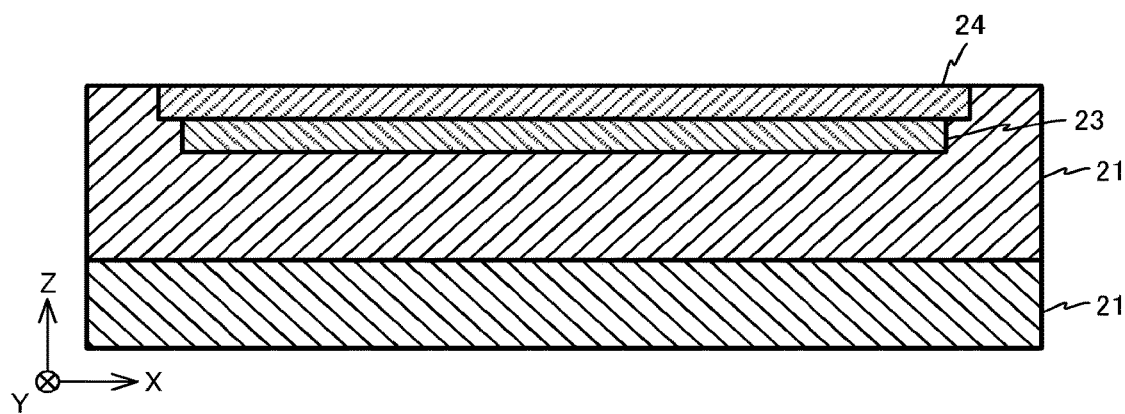
FIG. 6 is a diagram illustrating a manufacturing process of the photodetector.

Next, as illustrated in FIG. 6, the P+ type semiconductor layer 23 is formed on the upper surface of the P− type semiconductor layer 22 by implanting impurities, such as boron, into the semiconductor substrate 21.

Figure 7:
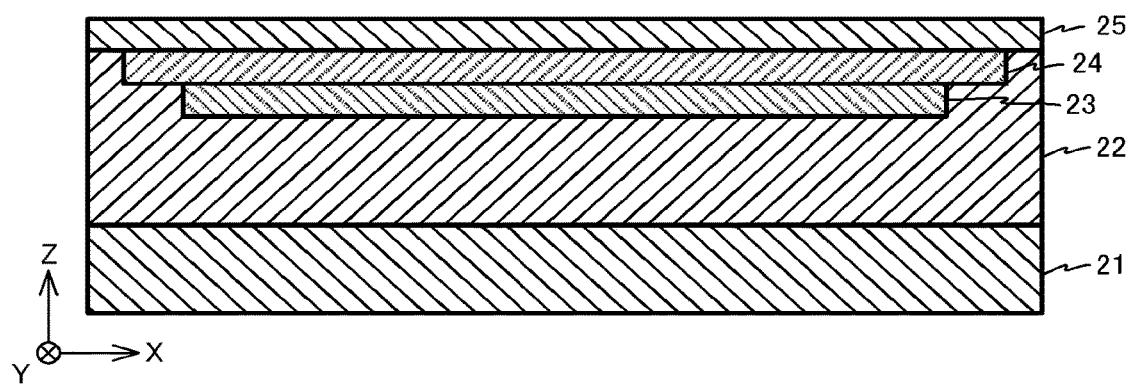
FIG. 7 is a diagram illustrating a manufacturing process of the photodetector.

Next, as illustrated in FIG. 7, the insulation layer 25 is formed on the upper surfaces of the semiconductor layers 23 and 24. The insulation layer 25 can be formed, for example, by CVD or sputtering. In sputtering, it is conceivable to use silicon dioxide ($SiO_2$), silicon nitride (SiNx) or the like as a target.

Figure 8:
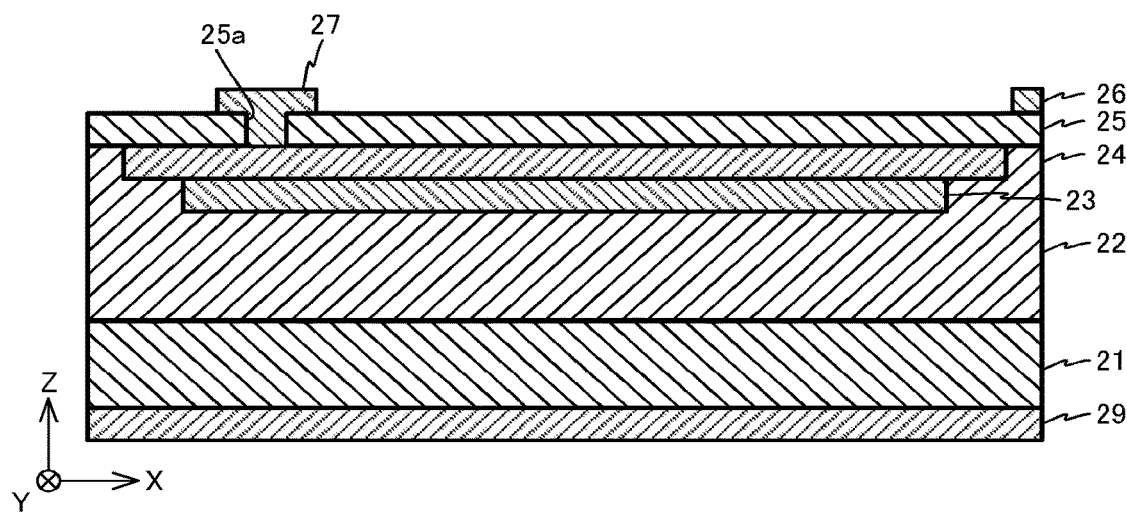
FIG. 8 is a diagram illustrating a manufacturing process of the photodetector.

Next, as illustrated in FIG. 8, the contact electrode 27 and the common wire 26 are formed on the upper surface of the insulation layer 25. When forming the contact electrode 27 and the common wire 26, first, a through hole 25a is formed in the insulation layer 25. The through hole 25a can be formed by photolithography. Specifically, a resist having an opening formed at a place corresponding to the through hole 25a is formed on the upper surface of the insulation layer 25. Then, the insulation layer 25 is etched with the resist as a mask to form the through hole 25a. Next, the resist is removed, and a resist having openings formed at places corresponding to the contact electrode 27 and the common wire 26 is formed on the upper surface of the insulation layer 25. Then, the contact electrode 27 and the common wire 26 are formed by sputtering or the like. In the sputtering, a metal such as aluminum is used as a target.

After the contact electrode 27 and the common wire 26 are formed, the resist is removed. Thereby, the formation of the contact electrode 27 and the common wire 26 on the upper surface of the insulation layer 25 completes as illustrated in FIG. 8.

Next, as illustrated in FIG. 2, the quench resistor 28 is formed on the upper surface of the insulation layer 25 across the contact electrode 27 and the common wire 26. The quench resistor 28 constituted by the graphene layer can be formed, for example, by the transfer method.

At present, for example, a sheet having a graphene layer formed on the upper surface thereof is available. This kind of sheet includes a resin film formed as a support material on the upper surface of the graphene layer. First, a sheet having a rectangular graphene layer formed thereon is prepared. Then, the graphene layer is peeled off from the sheet and floated on pure water. The size of the graphene layer is, for example, substantially comparable to the upper surface of the photodetector 10 illustrated in FIG. 1.

Figure 9:
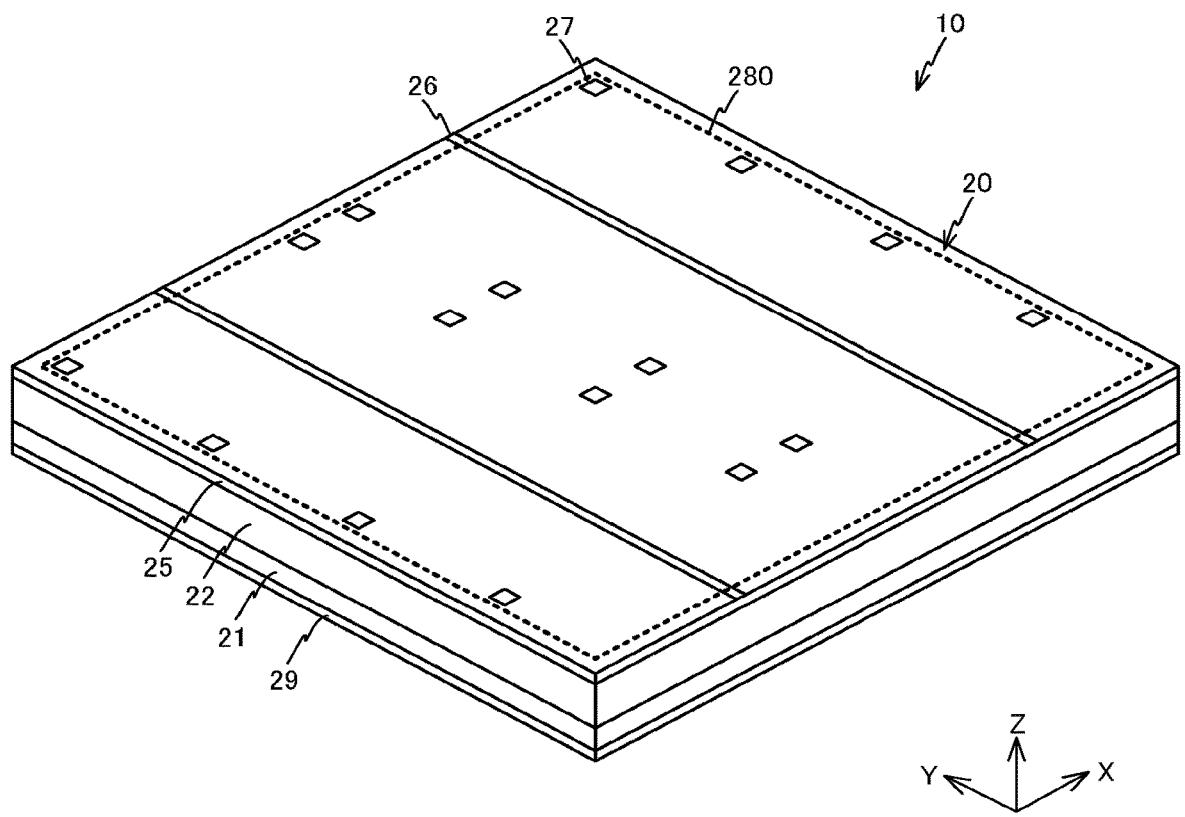
FIG. 9 is a diagram illustrating a manufacturing process of the photodetector.

Next, the photodetector 10 in which the contact electrode 27 and the common wire 26 have been formed is sunk, and each graphene layer is positioned with respect to the upper surface of the photodetector 10. Then, by causing the photodetector 10 to move upward, the graphene layer floating on the water is mounted on the upper surface of the photodetector 10. Subsequently, in a state where the graphene layer is mounted on the light detector 20, the photodetector 10 is pulled up from the pure water. As illustrated in FIG. 9, when pulled up from the pure water, the photodetector 10 is in a state where the upper surface is coated by a graphene layer 280 that finally serves as the quench resistor 28.

Next, the photodetector 10 is dried, and then annealing treatment is performed appropriately. Thereby, the adhesion between the insulation layer 25 of the photodetector 10 and the graphene layer 280 is improved. Then, the resin film remaining as the support material on upper surface of the graphene layer 280 is removed using a solvent.

Next, the graphene layer 280 is patterned by a lithography treatment so as to form the meandering quench resistor 28 connected to the common wire 26 and the contact electrode 27, as illustrated in FIG. 1, in each light detector 20 of the photodetector 10.

Thereby, the formation of the photodetector 10 completes. Regarding the order of manufacturing processes, it is possible to form the graphene layer preliminarily before forming the contact electrode and the common wire.

As described above, in the photodetector 10 according to the present embodiment, the quench resistor 28 for suppressing the electron avalanche from occurring in the light detector 20 is constituted by the graphene layer 280 that is highly transparent and has transmitting properties to visible light. Accordingly, even when the quench resistor 28 is wired while being routed on the light detector 20, there is no reduction in the aperture ratio of the light detector 20. Accordingly, the sensitivity of the light detector 20 can be improved, and as a result, the sensitivity of the photodetector 10 can be improved.

Figure 10:
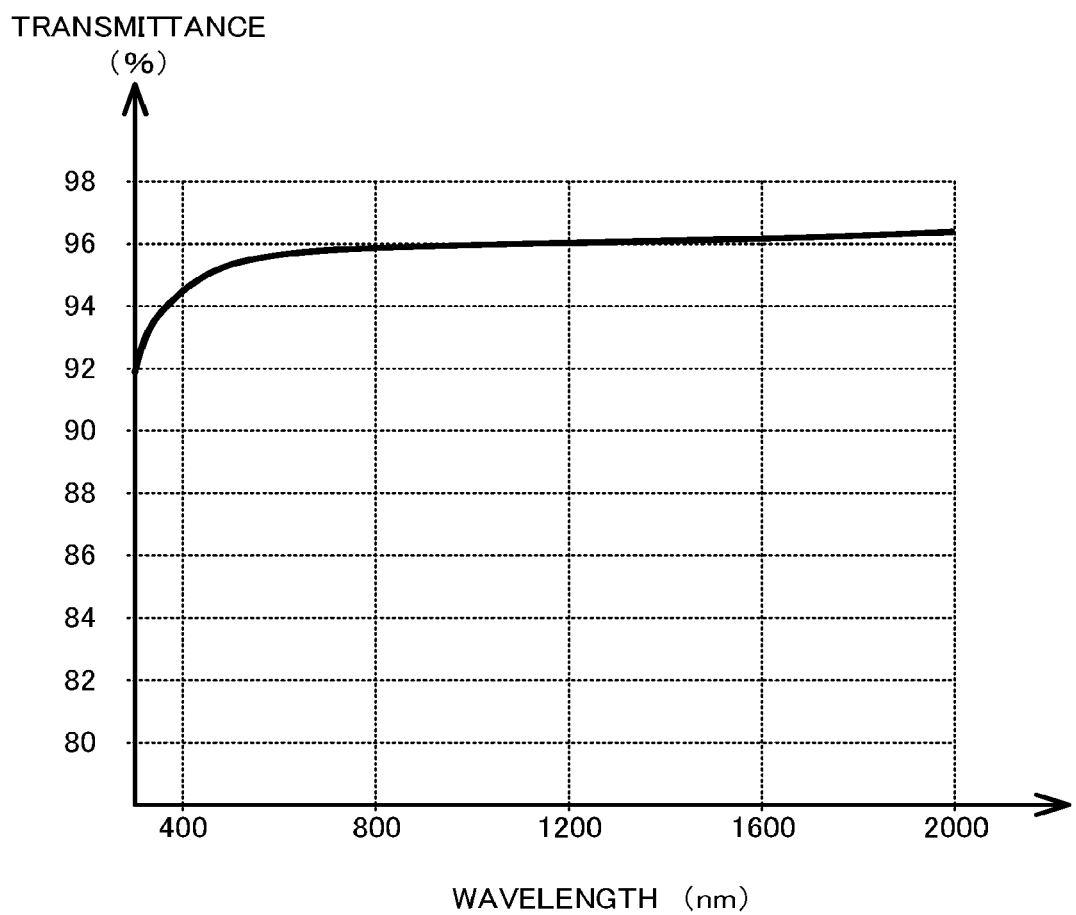
FIG. 10 is a graph illustrating a relationship between transmittance and wavelength of a quench resistor.

FIG. 10 is a graph illustrating a relationship between transmittance and wavelength of the quench resistor 28 constituted by a single graphene layer. As illustrated in FIG. 10, the quench resistor 28 has a transmittance of approximately 90% or more for visible light having a wavelength of 380 nm and light having a longer wavelength than the visible light. Accordingly, the photodetector 10 according to the present embodiment can detect visible light and light having a longer wavelength than the visible light with good sensitivity.

In the above-mentioned exemplary embodiment, the quench resistor 28 is constituted by the graphene layer although it is not limited to this example. The quench resistor 28 may not necessarily be formed of the graphene layer if the translucency to the detection light is satisfactory. Under the premise that the translucency to the detection light is satisfactory, the quench resistor 28 may be constituted, for example, by a monoatomic layer, a unimolecular layer, or a two-dimensional semiconductor layer.

Further, in the above-mentioned exemplary embodiment, the semiconductor substrate 21 is P+ type, the semiconductor layer 22 is P− type, the semiconductor layer 23 is P+ type, and the semiconductor layer 24 is N+ type, although they are not limited to these examples. As one example, the semiconductor substrate 21 may be configured to be N+ type, the semiconductor layer 22 may be configured to be N− type, the semiconductor layer 23 may be configured to be N+ type, and the semiconductor layer 24 may be configured to be P+ type. As another example, the semiconductor substrate 21 may be configured to be P+ type, the semiconductor layer 22 may be configured to be N− type, the semiconductor layer 23 may be configured to be P+ type, and the semiconductor layer 24 may be configured to be N+ type, and further, the semiconductor layer 23 may be positioned in contact with the semiconductor substrate 21 so that the semiconductor layer 22 is positioned between the semiconductor layer 23 and the semiconductor layer 24. Alternatively, the semiconductor substrate 21 may be configured to be N+ type, the semiconductor layer 22 may be configured to be P− type, the semiconductor layer 23 may be configured to be N+ type, and the semiconductor layer 24 may be configured to be P+ type, and further, the semiconductor layer 23 may be positioned in contact with the semiconductor substrate 21 so that the semiconductor layer 22 is positioned between the semiconductor layer 23 and the semiconductor layer 24.

Second Embodiment

Figure 11:
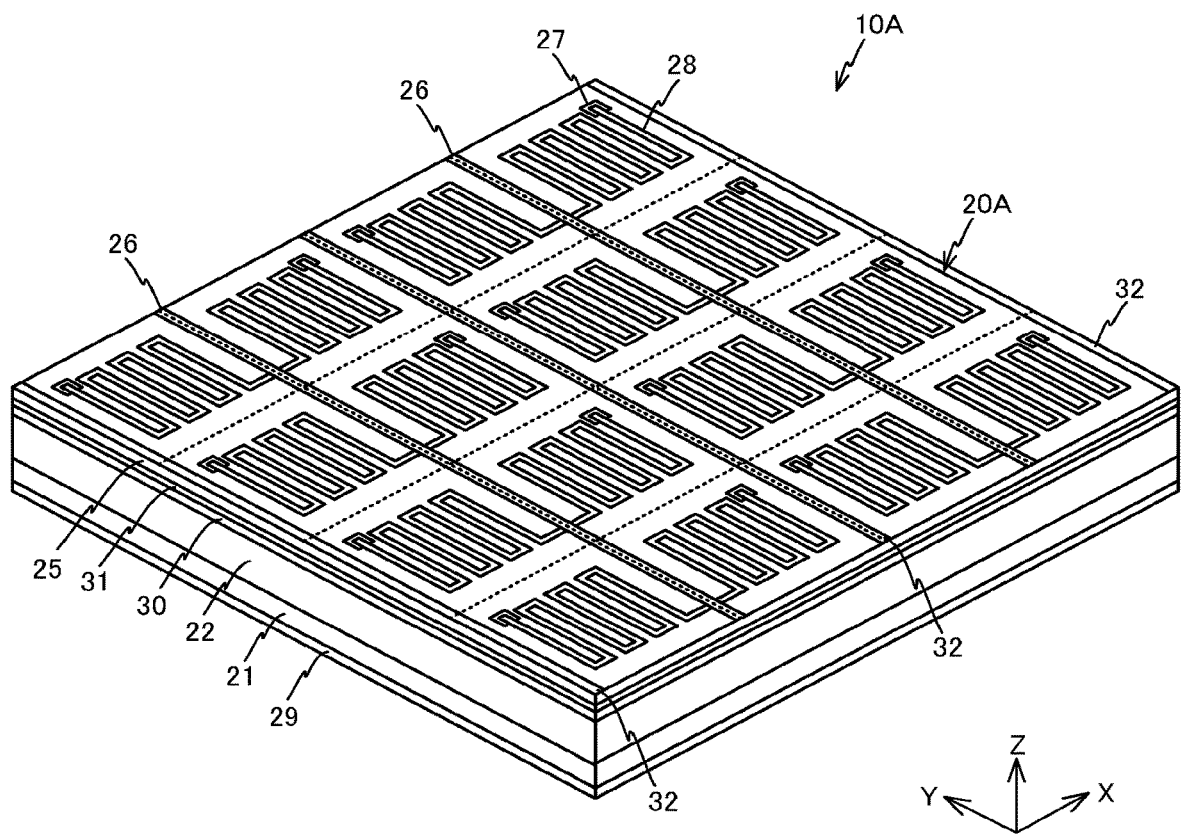
FIG. 11 is a perspective view of a photodetector according to a second exemplary embodiment.

Next, a second exemplary embodiment will be described with reference to drawings. Configurations similar or comparable to those in the first embodiment are denoted by same reference numerals and detailed descriptions thereof are omitted or simplified. FIG. 11 is a perspective view of a photodetector 10A according to the present embodiment. The photodetector 10A is different from the photodetector 10 according to the first embodiment in that an insulation layer 30 and an electrode layer 31 are provided between the insulation layer 25 and the semiconductor layer 22 and a control wire 32 is wired on the upper surface thereof.

Figure 12:
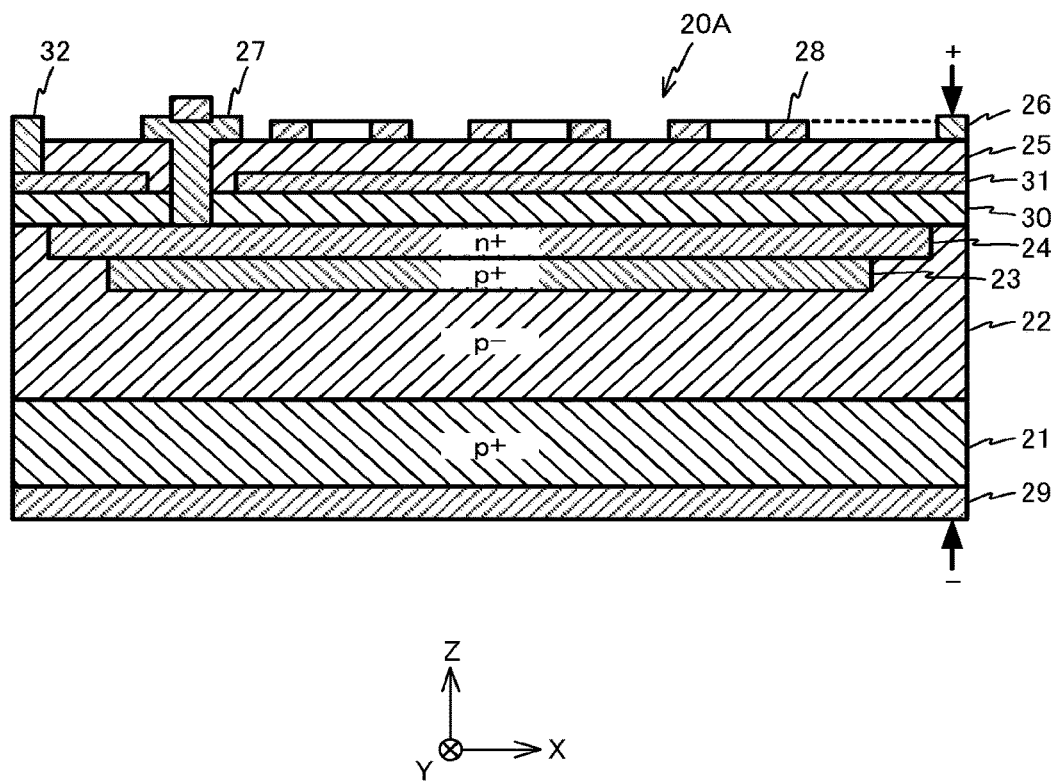
FIG. 12 is a cross-sectional view of a light detector formed in the photodetector.

FIG. 12 is a cross-sectional view of a light detector 20A formed in the photodetector 10A. As illustrated in FIG. 12, the insulation layer 30 is stacked on the upper surfaces of the semiconductor layers 22 and 24. The insulation layer 30 is made of, for example, silicon dioxide ($SiO_2$), silicon nitride (SiNx) or the like. The insulation layer 30 can be formed by sputtering, chemical vapor deposition (CVD), or the like.

The electrode layer 31 is stacked on the upper surface of the insulation layer 30. The electrode layer 31 is constituted by an electrically conductive material that has a higher transmittance to the light to be detected by the photodetector 10. For example, indium tin oxide (ITO) can be used as the electrode layer 31. In this case, the electrode layer 31 can be formed, for example, by sputtering or the like. The electrode layer 31 can be also formed by using a graphene material.

The electrode layer 31 is electrically insulated from the contact electrode 27 and is electrically connected to the control wire 32 having an upper part exposed from the insulation layer 25. As illustrated in FIG. 11, the control wire 32 is a wiring line extending in the direction of Y-axis being the longitudinal direction. The control wire 32 is wired across four or eight light detectors 20.

In the above-mentioned light detector 20A of the photodetector 10A, a transistor is formed by the quench resistor 28 constituted by the graphene layer and the electrode layer 31. Therefore, in the light detector 20A, when a reverse bias voltage is applied as the driving voltage between the common wire 26 and the common electrode 29, it is possible to control the resistance value of the quench resistor 28 and the current flowing through the quench resistor by applying a desired voltage to the control wire 32.

Figure 13:
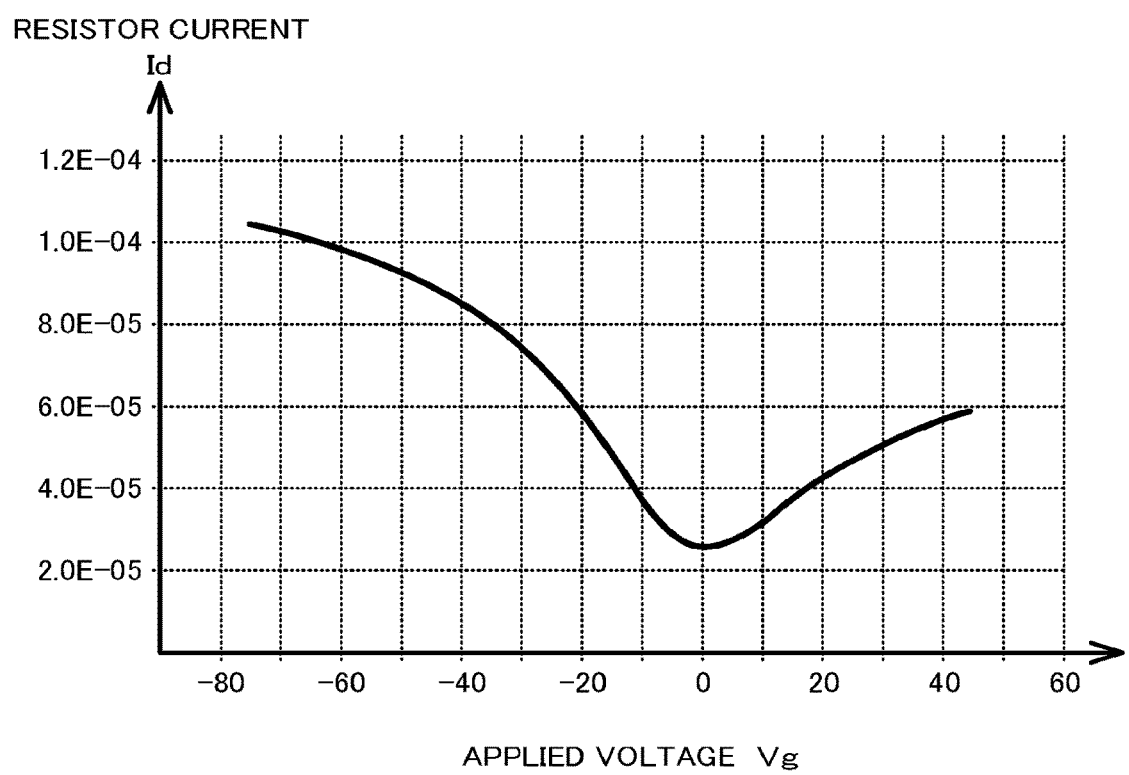
FIG. 13 is a graph illustrating a relationship between resistor current flowing through the quench resistor and voltage applied to an electrode layer.

For example, FIG. 13 is a graph illustrating a relationship between resistor current Id flowing through the quench resistor and voltage Vg applied to the electrode layer 31 via the control wire 32 when photons enter. In the graph illustrated in FIG. 13, the unit of the ordinate axis is arbitrary. As illustrated in FIG. 13, it is understood that, when a voltage is applied to the electrode layer 31, the resistor current Id with respect to the applied voltage Vg increases. This indicates that application of the voltage Vg makes a resistance value Rq of the quench resistor 28 small. Therefore, it is possible to adjust the output when photons enter the photodetector 10A by adjusting the voltage applied to the control wire 32 considering the usage of the photodetector 10A. The characteristic illustrated in FIG. 13 is a mere example. The voltage value of the applied voltage Vg that minimizes the resistor current Id is not limited to zero and can be set to a positive value or a negative value depending on the material of each part, manufacturing method, or voltage application conditions.

Figure 14:
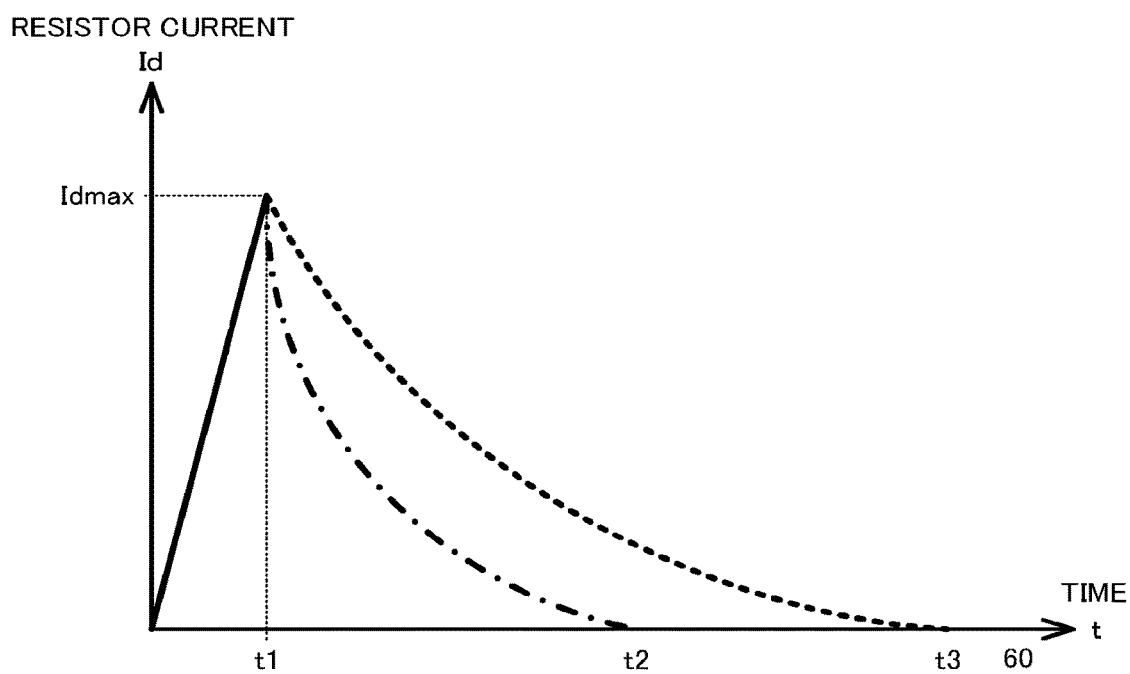
FIG. 14 is a graph illustrating a temporal transition of the resistor current flowing through the quench resistor.

For example, FIG. 14 is a graph illustrating a temporal transition of the resistor current Id flowing through the quench resistor 28 when one photon enters the light detector 20A. As illustrated in FIG. 14, when the photon enters the light detector 20A, the resistor current Id reaches a maximum value Idmax at elapsed time t1. In this case, if the applied voltage Vg is zero, the resistor current Id converges to zero at elapsed time t3, for example, as indicated by a dashed line. On the other hand, when the applied voltage Vg is larger than zero, the resistance value Rq of the quench resistor 28 becomes smaller. Therefore, the resistor current Id converges to zero at time t2 earlier than time t3.

As described above, in the photodetector 10A, by adjusting the voltage Vg applied to the electrode layer 31, it is possible to adjust the dead time of the photodetector 10A, that is, the period during which a sufficient signal is not generated in response to the incidence of the photon. Accordingly, for example, in a case where the photodetector 10A is used for a lidar device, photons can be accurately detected by applying the applied voltage Vg to the electrode layer 31, even when the photons enter at short intervals. On the other hand, stopping the application of the applied voltage Vg to the electrode layer 31 or setting the voltage value to zero can make the dead time longer. Since the avalanche multiplication due to thermally excited carriers being a noise source hardly occurs during the dead time, the occurrence frequency of after-pulse accompanying the avalanche multiplication decreases. Therefore, by appropriately increasing the dead time, the occurrence of the after-pulse at the time of photon detection can be reduced. As a result, the SN ratio of the photoelectric current of photons can be increased and the photons can be accurately detected.

Therefore, in the case where the photodetector 10A is used for the lidar device, the distance measurement can be accurately performed by setting the applied voltage Vg to zero if the measurement distance by the lidar device is longer and photons enter at longer intervals. On the other hand, the distance measurement can be accurately performed by setting the applied voltage Vg to a value lower than zero or higher than zero if the measurement distance by the lidar device is shorter and photons enter at shorter intervals.

Figure 15:
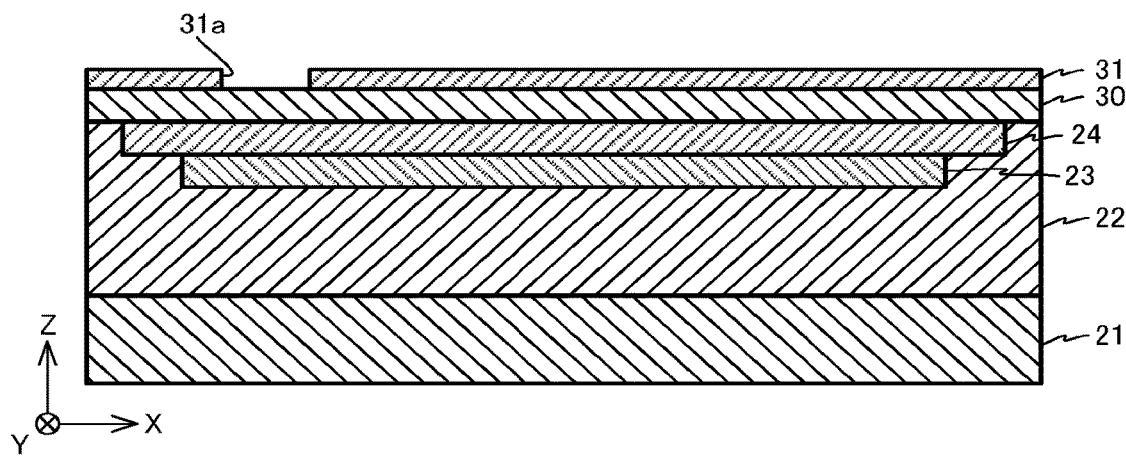
FIG. 15 is a diagram illustrating a manufacturing process of the photodetector.

Next, an exemplary method for manufacturing the photodetector 10A having the above-described configuration will be described. Like the manufacturing of the photodetector 10 according to the first embodiment, the semiconductor substrate 21 is prepared, and then the semiconductor layers 22, 23, and 24 are formed on the upper surface of the semiconductor substrate 21 as illustrated in FIG. 15. Subsequently, the insulation layer 30 is formed on the upper surfaces of the semiconductor layers 23 and 24.

Next, the electrode layer 31 having an opening 31a is stacked on the upper surface of the insulation layer 30. Specifically, the electrode layer 31 is formed, for example, by sputtering or the like. Further, a mask with an opening provided at the position corresponding to the opening 31a is formed on the upper surface of the electrode layer 31. Then, a portion of the electrode layer 31 exposed from the mask is etched. Thereby, the formation of the electrode layer 31 completes.

Figure 16:
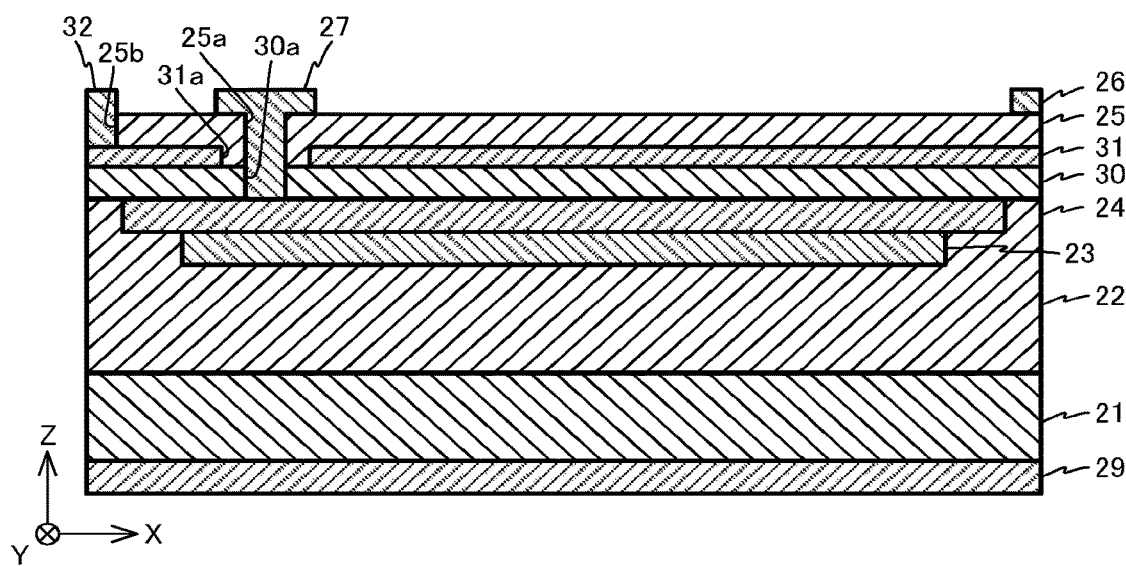
FIG. 16 is a diagram illustrating a manufacturing process of the photodetector.

Next, as illustrated in FIG. 16, the insulation layer 25 is formed on the upper surface of the electrode layer 31. Then, the contact electrode 27, the common wire 26, and the control wire 32 are formed on the upper surface of the insulation layer 25. When forming the contact electrode 27, the common wire 26, and the control wire 32, first, the through holes 25a and 30a are formed in the insulation layers 25 and 30 by photolithography so as to correspond to the opening 31a of the electrode layer 31. Further, an opening 25b communicating with the electrode layer 31 is formed in the insulation layer 25. Then, the contact electrode 27, the common wire 26, and the control wire 32 are formed by sputtering, CVD or the like.

Next, as illustrated in FIG. 2, the quench resistor 28 is formed across the contact electrode 27 and the common wire 26 on the upper surface of the insulation layer 25. Thereby, the formation of the photodetector 10 completes.

As described above, in the photodetector 10A according to the present embodiment, it is possible to adjust the dead time of the photodetector 10A by adjusting the voltage Vg applied to the electrode layer 31. Accordingly, for example, in the case of using the photodetector 10A for a lidar device, photons can be accurately detected by applying the voltage Vg to the electrode layer 31, even when the photons enter at short intervals. On the other hand, stopping the application of the applied voltage Vg to the electrode layer 31 can increase the SN ratio of the photoelectric current of photons, and as a result, photons can be detected accurately.

Figure 17:
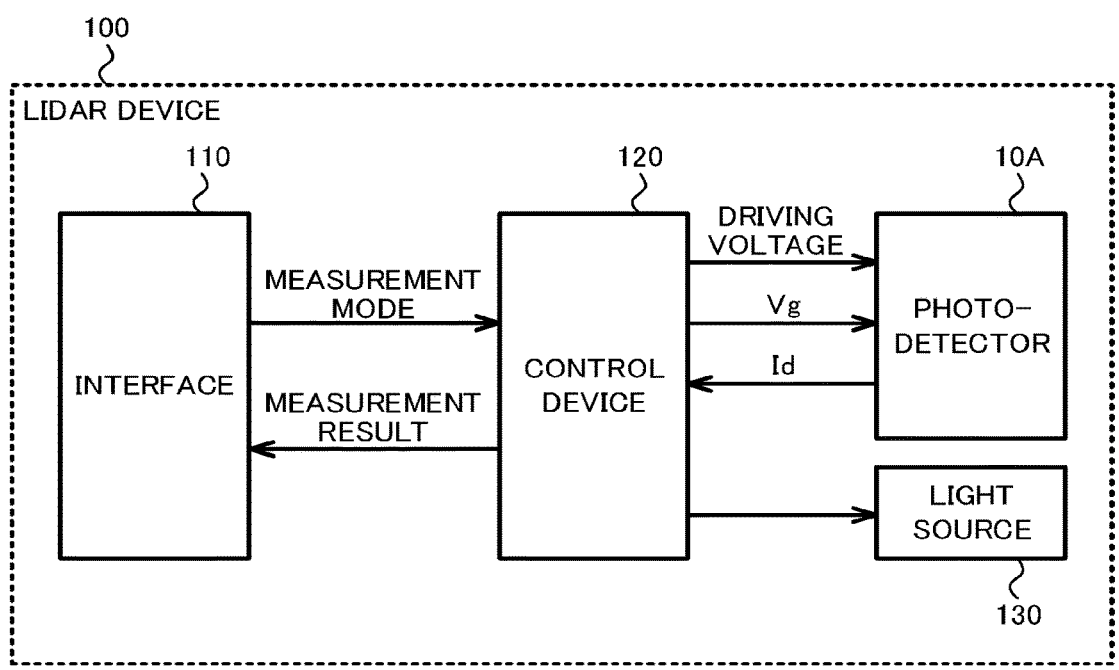
FIG. 17 is a diagram illustrating an example of a lidar device including the photodetector.

FIG. 17 is a diagram illustrating an exemplary lidar device 100 including the photodetector 10A having the above-described configuration. As illustrated in FIG. 17, the lidar device 100 includes an interface 110, a control device 120, the photodetector 10A, and light source 130 that emits light to an object. The lidar device 100 receives the reflected light generated by being irradiated from the light source to the object, and measures the distance to the object.

The interface 110 includes, for example, buttons for enabling a user to input commands, a connection port capable of communicating with a computer used by the user, and the like. The user can operate the control device 120 via the interface 110. Further, the control device 120 includes a central processing unit (CPU), a main storage unit serving as a work area of the CPU, and an auxiliary storage unit storing programs and the like to be executed by the CPU.

For example, when the user inputs a measurement distance by the lidar device 100, a measurement mode, and the like via the interface 110, the control device 120 controls the voltage Vg applied to the electrode layer 31 of the photodetector 10A according to the measurement distance and the measurement mode. Thereby, the dead time of the photodetector 10A can be appropriately set according to the measurement distance or the like.

The control device 120 calculates measurement results based on the resistor current Id (photoelectric current) output from the photodetector 10A, and displays the measurement results to the user via the interface 110.

Although the present invention has been described with reference to some exemplary embodiments, the present invention is not limited to these embodiments. For example, in the above-mentioned exemplary embodiment, as illustrated in FIG. 2, the quench resistor 28 is wired to meander on the upper surface of the insulation layer 25. However, the wiring pattern of the quench resistor 28 is not limited to the illustrated example. For example, the quench resistor 28 may be wired in a spiral shape on the upper surface of the insulation layer 25. The quench resistor 28 can be wired in an arbitrary pattern because the translucency to the detection light is adequate.

In the above-mentioned exemplary embodiments, the photodetectors 10 and 10A are configured to have sixteen light detectors 20 and 20A disposed in the matrix pattern of four rows and four columns as illustrated in FIG. 1. However, the photodetectors 10 and 10A are not limited to this arrangement. The number of light detectors 20 and 20A may be seventeen or more or fifteen or less.

The configurations of the photodetectors 10 and 10A and the manufacturing methods thereof described in the above-mentioned exemplary embodiments are mere examples and the configurations of the photodetectors 10 and 10A and the like can be modified in various ways.

In the exemplary embodiment illustrated in FIG. 12, the electrode layer 31 is disposed on the lower surface side (−Z side) of the quench resistor 28 via the insulation layer 25. However, the arrangement of the electrode layer 31 is not limited to this example. As another example, the electrode layer 31 may be disposed on the upper surface side (+Z side) of the quench resistor 28 via the insulation layer 25. Alternatively, the electrode layer 31 may be disposed on both the upper surface side and the lower surface side of the quench resistor 28.

In the photodetector according to the present embodiment, the quench resistor is constituted by the graphene layer that is highly transparent and has transmitting properties to visible light. Accordingly, even when the quench resistor is wired while being routed on the light detector, there is no reduction in the aperture ratio of the light detector. Accordingly, the sensitivity of the light detector can be improved, and as a result, the sensitivity of the photodetector can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A photodetector comprising:
 a light detector having a first semiconductor layer of a first conductive type and a second semiconductor layer of a second conductive type different from the first conductive type, in which a first surface of the second semiconductor layer and the first semiconductor layer constitute a PN junction; and
 a quench resistor being optically transmissive and connected to the second semiconductor layer.

2. The photodetector according to claim 1, wherein the quench resistor is stacked on a second surface side, which is opposite to the first surface, of the second semiconductor layer.

3. The photodetector according to claim 1, wherein the quench resistor is constituted by a monoatomic layer, a unimolecular layer, or a two-dimensional semiconductor layer.

4. The photodetector according to claim 1, wherein the quench resistor is constituted by a graphene layer.

5. The photodetector according to claim 1, comprising a resistance control electrode provided on one side of the quench resistor via an insulating layer.

6. The photodetector according to claim 5, further comprising a resistance control electrode provided on the other side of the quench resistor via an insulating layer.

7. The photodetector according to claim 5, wherein the resistance control electrode is disposed between the quench resistor and the second semiconductor layer.

8. The photodetector according to claim 6, wherein the resistance control electrode is stacked on the second semiconductor layer via the quench resistor.

9. The photodetector according to claim 5,
wherein the resistance control electrode is optically transmissive.

10. The photodetector according to claim 5, further comprising:
a plurality of the light detectors; and
a control wire connected to the each resistance control electrode of the plurality of the light detectors.

11. The photodetector according to claim 1, further comprising:
a plurality of the light detectors; and
a common wire connected to one side of the quench resistor of each of the plurality of the light detectors.

12. A lidar device comprising:
a light source that emits light to an object; and
a photodetector configured to receive reflected light of the light and including a light detector having a first semiconductor layer of a first conductive type and a second semiconductor layer of a second conductive type different from the first conductive type, in which the first semiconductor layer and the second semiconductor layer constitute a PN junction, and a quench resistor being optically transmissive and having one end connected to the second semiconductor layer.

* * * * *